United States Patent
Chavva et al.

(10) Patent No.: US 11,476,330 B2
(45) Date of Patent: Oct. 18, 2022

(54) SYSTEM AND TECHNIQUE FOR CREATING IMPLANTED REGIONS USING MULTIPLE TILT ANGLES

(71) Applicant: Applied Materials, Inc., Santa Clara, CA (US)

(72) Inventors: Venkataramana R. Chavva, Gloucester, MA (US); Hans-Joachim Gossmann, Gloucester, MA (US)

(73) Assignee: Applied Materials, Inc., Santa Clara, CA (US)

(*) Notice: Subject to any disclaimer, the term of this patent is extended or adjusted under 35 U.S.C. 154(b) by 51 days.

(21) Appl. No.: 17/077,408

(22) Filed: Oct. 22, 2020

(65) Prior Publication Data

US 2022/0130959 A1    Apr. 28, 2022

(51) Int. Cl.
*H01L 29/06* (2006.01)
*H01L 21/265* (2006.01)

(52) U.S. Cl.
CPC .... *H01L 29/0684* (2013.01); *H01L 21/26586* (2013.01)

(58) Field of Classification Search
CPC combination set(s) only.
See application file for complete search history.

(56) References Cited

U.S. PATENT DOCUMENTS

| | | | |
|---|---|---|---|
| 2004/0099818 A1 | 5/2004 | Jun et al. | |
| 2018/0366566 A1 | 12/2018 | Suzuki et al. | |
| 2019/0019865 A1 | 1/2019 | Tang | |
| 2020/0194550 A1* | 6/2020 | Baburske | H01L 29/36 |

FOREIGN PATENT DOCUMENTS

| | | |
|---|---|---|
| CN | 110364436 A | 10/2019 |
| CN | 110581176 A | 12/2019 |

OTHER PUBLICATIONS

International Search Report and Written dated Jan. 10, 2022 in corresponding PCT application No. PCT/US2021/051676.

* cited by examiner

*Primary Examiner* — Farun Lu
*Assistant Examiner* — Mohammad A Rahman
(74) *Attorney, Agent, or Firm* — Nields, Lemack & Frame, LLC

(57) ABSTRACT

A system and method for creating various dopant concentration profiles using a single implant energy is disclosed. A plurality of implants are performed at the same implant energy but different tilt angles to implant ions at a variety of depths. The result of these implants may be a rectangular profile or a gradient profile. The resulting dopant concentration profile depends on the selection of tilt angles, doses and the number of implants. Varying tilt angle rather than varying implant energy to achieve implants of different depths may significantly improve efficiency and throughput, as the tilt angle can be changed faster than the implant energy can be changed. Additionally, this method may be performed by a number of different semiconductor processing apparatus.

15 Claims, 7 Drawing Sheets

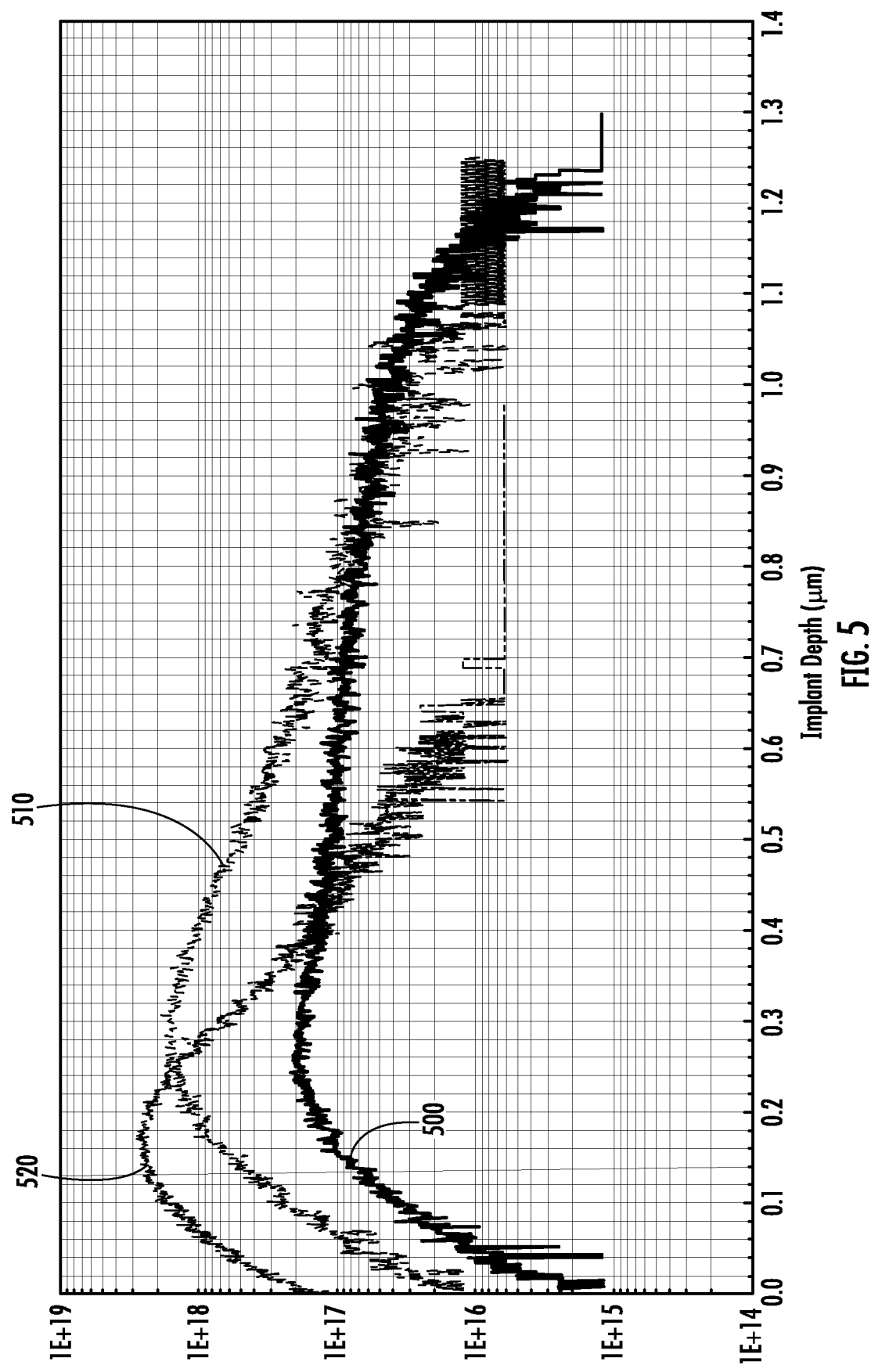

SYSTEM AND TECHNIQUE FOR CREATING IMPLANTED REGIONS USING MULTIPLE TILT ANGLES

FIELD

Embodiments of this disclosure are directed to systems and methods for forming implanted regions having a dopant concentration profile that cannot be created using a single implant, and more particularly for creating implanted regions having a rectangular or gradient profile using a single implant energy and multiple tilt angles.

BACKGROUND

There are various semiconductor devices which utilize an implanted region having a predefined dopant concentration profile embedded in the workpiece.

One specific type of device is referred to as an insulated gate bipolar transistor (IGBT). An IGBT combines concepts from bipolar transistors and MOSFETs to achieve an improved power device. The emitter and the gate are disposed on one side of the device, while the collector is disposed on the opposite second side of the device. The emitter is in communication with a heavily p-doped region disposed directly below the emitter. On either side of the heavily p-doped region are heavily n-doped regions, each in communication with the gate. Beneath the heavily p-doped region is a lightly p-doped region. On the opposite side of the device is a second heavily p-doped region, in communication with the collector. Finally, between the second heavily p-doped region and the lightly p-doped region is a lightly n-doped drift layer.

In conventional IGBT devices, the thickness of the lightly n-doped drift layer is determined based on the need to sustain the electrical field. As the power ratings for these devices increases, the overall thickness of the device also increases.

One technique to reduce the thickness of these IGBT transistors is to incorporate a heavily n-doped field stop layer between the lightly n-doped drift layer and the second heavily p-doped region. The electrical field decreases rapidly within this field stop layer, allowing thinner devices to be created. In certain embodiments, the field stop layer has a rectangular or box profile.

In certain embodiments, this field stop layer is created by implanting ions, such as hydrogen ions, into the lightly n-doped drift layer. This field stop layer may be disposed adjacent to the second heavily p-doped region.

Additionally, the field stop layer may have a thickness that is 1 or more µm. Creating an implanted region of this thickness typically involves a plurality of implants, each done at a different implant energy.

Other types of devices also make use of specially implanted regions. For example, photodiodes typically have a deep trench for isolation and logic devices typically implement P-wells and N-wells. In each of these devices, the implanted region is traditionally formed using a plurality of implants, each at a different implant energy.

In certain embodiments, the desired dopant concentration profile of the implanted region may resemble a box or rectangle, where the concentration remains roughly constant over a range of depths. In other embodiments, the desired dopant concentration profile of the implanted region may be a gradient profile, where the desired concentration profile varies with depth.

However, changing the implant energy of a semiconductor implantation system is time consuming. Specifically, the voltages applied to various electrodes, accelerators, acceleration/deceleration stages, magnets, and focusing elements is changed for each of these implant energies. Modifying these voltages may take many minutes. Thus, throughput and utilization are greatly affected by the modification of the implant energy.

Therefore, it would be beneficial if there was a method of processing a semiconductor workpiece that could create implanted regions having these desired dopant concentration profiles in a more efficient manner. Further, it would be advantageous if this method was applicable to a variety of different types of semiconductor processing equipment.

SUMMARY

A system and method for creating various dopant concentration profiles using a single implant energy is disclosed. A plurality of implants are performed at the same implant energy but different tilt angles to implant ions at a variety of depths. The result of these implants may be a rectangular profile or a gradient profile. The resulting dopant concentration profile depends on the selection of tilt angles, doses and the number of implants. Varying tilt angle rather than varying implant energy to achieve implants of different depths may significantly improve efficiency and throughput, as the tilt angle can be changed faster than the implant energy can be changed. Additionally, this method may be performed by a number of different semiconductor processing apparatus.

According to one embodiment, a method of forming an implanted region having a rectangular concentration profile within a semiconductor workpiece is disclosed. The method comprises performing a first implant on the semiconductor workpiece, wherein the first implant is performed at a predetermined implant energy and a first tilt angle, wherein a maximum concentration of ions implanted by the first implant occurs at a first depth; and performing a second implant on the semiconductor workpiece, wherein the second implant is performed at the predetermined implant energy and a second tilt angle, wherein the maximum concentration of ions implanted by the second implant occurs at a second depth, less than the first depth; wherein the second tilt angle is selected such that, after the first and second implants are performed, a minimum concentration between the first depth and the second depth is greater than a predetermined minimum concentration. In certain embodiments, the first tilt angle is at or near 0° and the predetermined implant energy is selected such the first depth is at a desired depth. In some embodiments, the method comprises performing a third implant on the semiconductor workpiece, wherein the third implant is performed at the predetermined implant energy and a third tilt angle, greater than the second tilt angle, wherein the maximum concentration of ions implanted by the third implant occurs at a third depth, less than the first depth and the second depth; wherein the third tilt angle is selected such that, after the first, second and third implants are performed, a minimum concentration between the first depth and the third depth is greater than the predetermined minimum concentration. In some embodiments, a thickness of the implanted region, wherein thickness is defined as a maximum depth having a concentration greater than the predetermined minimum concentration, less a minimum depth having the concentration greater than the predetermined minimum concentration, is greater than 1 µm. In certain embodiments, the thickness of the implanted region is greater than 2 μm. In some embodiments, a ratio of a maximum concentration between the first depth and the third depth to the minimum concentration is less than 5. In certain embodiments, the ratio of the maximum concentration to the minimum concentration is less than 4. In certain embodiments, the ratio of the maximum concentration to the minimum concentration is less than 3. In some embodiments, the first implant is performed with a first dose, the second implant is performed with a second dose and the third implant is performed with a third dose, wherein the first dose, the second dose and the third dose are not all the same value. In some embodiments, one or more additional implants are performed at additional tilt angles, between the first tilt angle and the third tilt angle, so as to reduce a ratio of a maximum concentration between the first depth and the third depth to the minimum concentration.

According to another embodiment, a semiconductor processing apparatus is disclosed. The apparatus comprises an ion source to generate ions; an accelerator to provide energy to the ions; a platen to hold a semiconductor workpiece; a platen orientation motor to adjust a tilt angle of the platen; and a controller; wherein the controller is configured to create an implanted region having rectangular concentration profile in the semiconductor workpiece, wherein the controller: sets an implant energy by adjusting a voltage supplied to the accelerator; sets a first tilt angle using the platen orientation motor; performs a first implant at the implant energy and the first tilt angle, wherein a maximum concentration of ions implanted in the semiconductor workpiece by the first implant occurs at a first depth; sets a second tilt angle using the platen orientation motor; performs a second implant at the implant energy and the second tilt angle, wherein the maximum concentration of ions implanted in the semiconductor workpiece by the second implant occurs at a second depth, less than the first depth; sets a third tilt angle using the platen orientation motor; and performs a third implant at the implant energy and the third tilt angle, wherein the maximum concentration of ions implanted in the semiconductor workpiece by the third implant occurs at a third depth, less than the first depth and the second depth; wherein the first tilt angle, the second tilt angle and the third tilt angle are selected such that a minimum concentration between the first depth and the third depth is greater than a predetermined minimum concentration, and a ratio of a maximum concentration to the minimum concentration is less than 5. In some embodiments, the first implant is performed with a first dose, the second implant is performed with a second dose and the third implant is performed with a third dose, wherein the first dose, the second dose and the third dose are not all the same value. In certain embodiments, the controller performs one or more additional implants at additional tilt angles, between the first tilt angle and the third tilt angle, so as to reduce the ratio of a maximum concentration to the minimum concentration. In certain embodiments, the first tilt angle, the second tilt angle and the third tilt angle are selected such that the ratio of the maximum concentration to the minimum concentration is less than 3.

According to another embodiment, a method of forming an implanted region having a gradient concentration profile within a semiconductor workpiece is disclosed. The method comprises performing a first implant on the semiconductor workpiece, wherein the first implant is performed at a predetermined implant energy, a first dose and a first tilt angle; and performing a second implant on the semiconductor workpiece, wherein the second implant is performed at the predetermined implant energy, a second dose and a second tilt angle; wherein the first tilt angle, the first dose, the second tilt angle, and the second dose are selected such that, after the first and second implants are performed, a concentration of implanted atoms decreases between a first depth and a second depth. In certain embodiments, when plotted on a semi-log graph, a profile of the concentration of implanted atoms decreases roughly linearly between the first depth and the second depth. In some embodiments, the first dose is different from the second dose. In some embodiments, the method further comprises performing a third implant on the semiconductor workpiece, wherein the third implant is performed at the predetermined implant energy, a third dose and a third tilt angle; wherein the third tilt angle and the third dose are selected such that, after the first, second and third implants are performed, when plotted on a semi-log graph, a profile of the concentration of implanted atoms decreases roughly linearly between the first depth and the second depth. In certain embodiments, one of the implants is performed at a tilt angle to allow channeling of atoms in the semiconductor workpiece.

BRIEF DESCRIPTION OF THE FIGURES

For a better understanding of the present disclosure, reference is made to the accompanying drawings, which are incorporated herein by reference and in which:

FIG. 5 shows the three implants used to generate the dopant concentration profile shown in FIG. 4.

DETAILED DESCRIPTION

The present disclosure describes the use of multiple tilt angles to enable the formation of implanted regions having a desired dopant concentration profile in a workpiece without modifying the implant energy. This technique is applicable to various types of semiconductor process apparatus. Several of these apparatuses are described below.

Figure 1A:
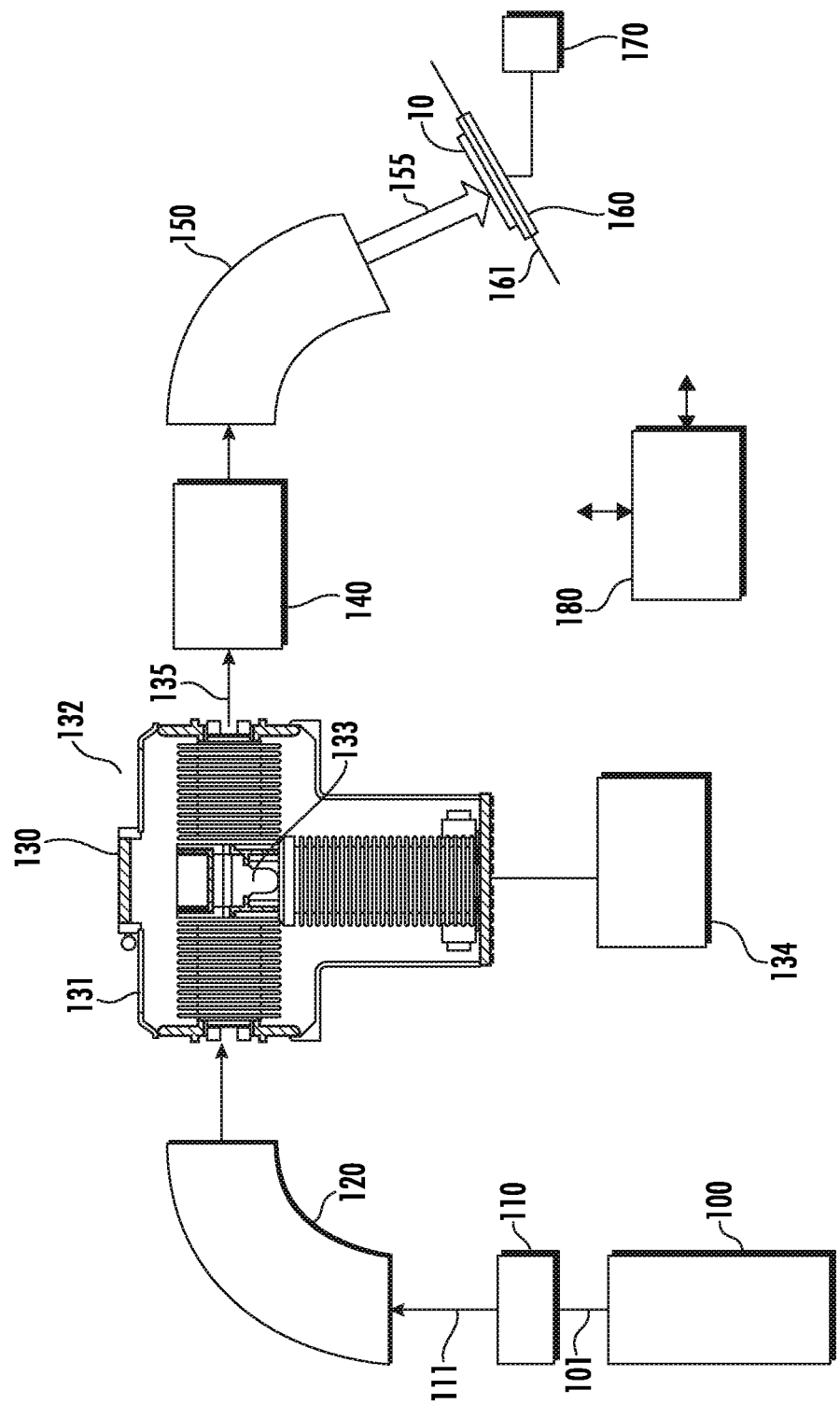
FIG. 1A shows a semiconductor processing apparatus that may be utilized according to one embodiment.

As shown in FIG. 1A, a semiconductor processing apparatus comprises an ion source 100, which is used to generate an ion beam. In one embodiment, a positive ion beam 101 may be created in the traditional manner, such as using a Bernas or indirectly heated cathode (IHC) ion source. Of course, other types of ion sources may also be employed. A feedgas is supplied to the ion source 100, which is then energized to generate ions. In certain embodiments, the feedgas may be hydrogen, boron, phosphorus, arsenic, helium, or other suitable species. Extraction optics are then used to extract these ions from the ion source 100.

The positive ion beam 101 exiting the ion source 100 may be coupled to a Mg charge exchange cell 110, which transforms the positive ion beam 101 into a negative ion beam 111. Of course, other mechanisms for the generation of a negative ion beam are known in the art. The mechanism used to create the negative ion beam is not limited by this disclosure.

The negative ion beam 111 may be directed toward a mass analyzer 120, which only allows the passage of certain species of ions. The negative ions that exit the mass analyzer 120 are directed toward a tandem accelerator 130.

The tandem accelerator 130 has two pathways, which are separated by a stripper tube 133. The input pathway 131 comprises a plurality of input electrodes. These input electrodes may be any suitable electrically conductive material, such as titanium or other metals. The outermost input electrode may be grounded. Each of the subsequent input electrodes may be biased at an increasingly more positive voltage moving closer to the stripper tube 133.

The input pathway 131 leads to the stripper tube 133. The stripper tube 133 is biased positively relative to the outermost input electrode. The stripper tube 133 includes an injection conduit where a stripper gas is injected. The stripper gas may comprise neutral molecules. These neutral molecules may be any suitable species such as, but not limited to argon and nitrogen. The stripper tube 133 has an inlet disposed on the same side as the input pathway 131. The outlet of the stripper tube 133 is in communication with the output pathway 132.

In other words, the stripper tube 133 is positively biased so as to attract the negative ion beam 111 through the input pathway 131. The stripper tube 133 removes electrons from the incoming ions, transforming them from negative ions into positive ions.

The stripper tube 133 is more positive than the electrodes in the output pathway 132. Each subsequent output electrode may be less positively biased moving away from the stripper tube 133. For example, the outermost output electrode may be grounded. Thus, the positive ions in the stripper tube 133 are accelerated through the output pathway 132.

In this way, the ions are accelerated two times. First, negative ions are accelerated through the input pathway 131 to the stripper tube 133. This acceleration is based on the difference between the voltage of the outermost input electrode and the voltage of the stripper tube 133. Next, positive ions are accelerated through the output pathway 132. This acceleration is based on the difference between the voltage of the stripper tube 133 and the voltage of the outermost output electrode in the output pathway 132.

An accelerator power supply 134 may be used to supply the voltages to the stripper tube 133, as well as the electrodes in the input pathway 131 and the output pathway 132. The accelerator power supply 134 may be capable of supply a voltage up to 2.5 MV, although other voltages, either higher or lower, are also possible. Thus, to modify the implant energy, the voltage applied by the accelerator power supply 134 is changed.

After exiting the tandem accelerator 130, the positive ion beam 135 may enter a filter magnet 140, which allows passage of ions of only a certain charge. In other embodiments, the filter magnet 140 may not be employed. The output of the filter magnet 140 may pass through a scanner 150, which serve to create the final ion beam 155 containing the desired species of ions. The scanner 150 causes the incoming ion beam to be fanned in the width direction so as to form a scanned ribbon ion beam. The output of the scanner 150 is then directed toward a platen 160. A workpiece 10 may be disposed on the platen 160. In certain embodiments, a corrector magnet may be disposed between the scanner 150 and the platen 160.

The platen 160 may be in communication with a platen orientation motor 170. The platen orientation motor 170 may be configured to move the platen 160 in any of a plurality of different directions. For example, the platen orientation motor 170 may have the capability to rotate the platen 160. Rotation occurs about an axis that is normal to the surface of the platen 160 and passes through the center of the workpiece (or platen). The angle of rotation may be referred to as the twist angle.

Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

Additionally, the semiconductor processing apparatus includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the accelerator power supply 134, so as to control the implant energy. In addition, the controller 180 may be in communication with the platen orientation motor 170, so as to adjust the tilt angle and twist angle of the platen 160. The controller 180 may also be in communication with other components.

Figure 1B:
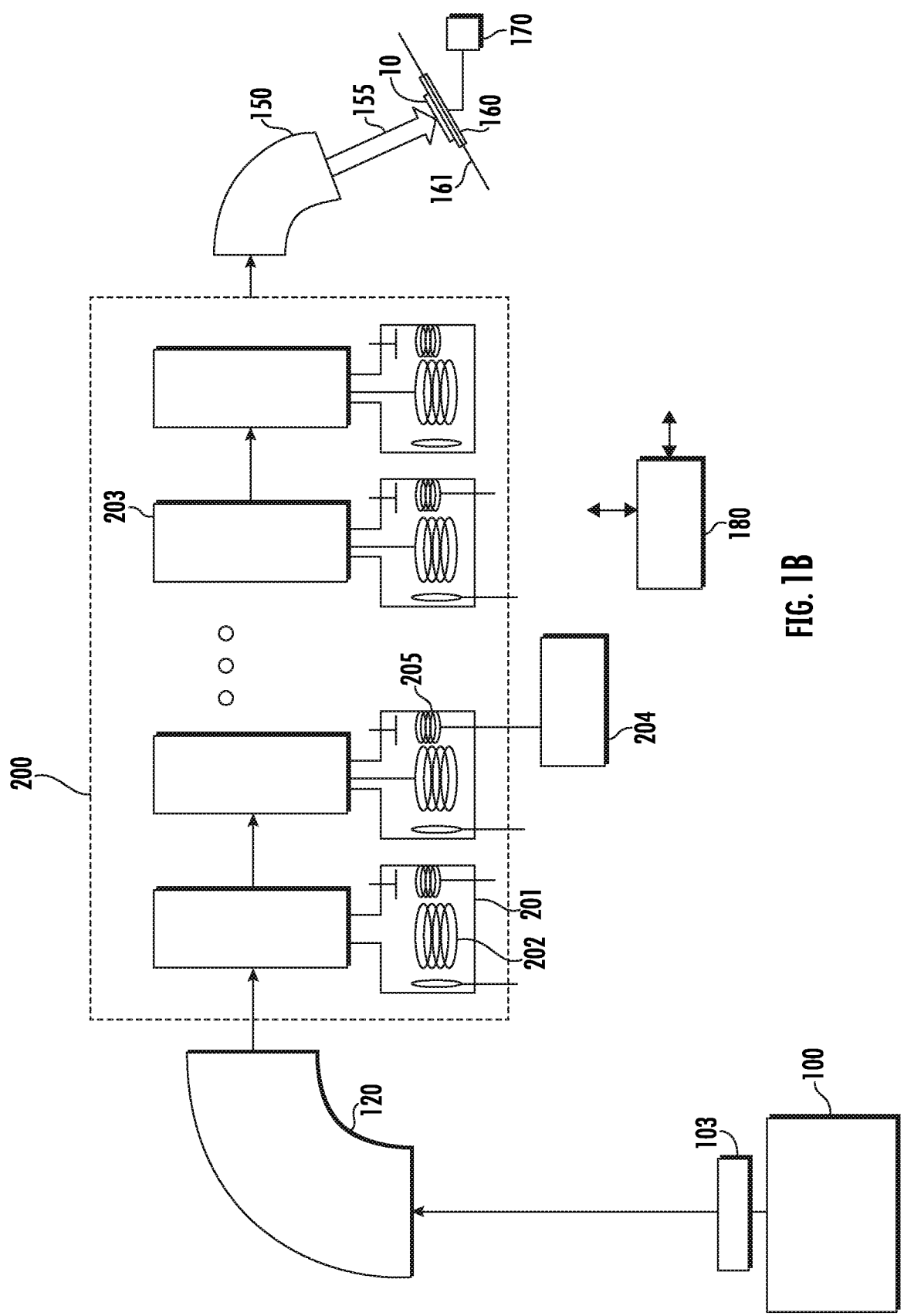
FIG. 1B shows a semiconductor processing apparatus that may be utilized according to a second embodiment.

A second embodiment is shown in FIG. 1B. Components that are common with FIG. 1A are given identical reference designators.

As described above, a semiconductor processing apparatus comprises an ion source 100, which is used to generate an ion beam. The ion source 100 has an aperture through which ions may be extracted from the ion source 100. These ions may be extracted from the ion source 100 by applying a negative voltage to the extraction optics 103 disposed outside the ion source 100, proximate the extraction aperture. The extraction optics 103 may be pulsed so that ions exit at specific times. The group of ions that exits may be referred to as a bunch. In one embodiment, a plurality of bunched ions may be created. The ions may then enter a mass analyzer 120, which may be a magnet that allows ions having a particular mass to charge ratio to pass through. This mass analyzer 120 is used to separate only the desired ions. It is the desired ions that then enter the linear accelerator 200.

The linear accelerator 200 comprises one or more cavities 201. Each cavity 201 comprises a resonator coil 202 that may be energized by electromagnetic fields created by an excitation coil 205. The excitation coil 205 is disposed in the cavity 201 with a respective resonator coil 202. The excitation coil 205 is energized by an excitation voltage, which may be a RF signal. The excitation voltage may be supplied by a respective RF generator 204. In other words, the excitation voltage applied to each excitation coil 205 may be independent of the excitation voltage supplied to any other excitation coil 205. Each excitation voltage is preferably modulated at the resonance frequency of its respective cavity 201.

When an excitation voltage is applied to the excitation coil 205, a voltage is induced on the resonator coil 202. The result is that the resonator coil 202 in each cavity 201 is driven by a sinusoidal voltage. Each resonator coil 202 may be in electrical communication with a respective accelerator electrode 203. The ions pass through apertures in each accelerator electrode 203.

The entry of the bunch into a particular accelerator electrode 203 is timed such that the potential of the accelerator electrode 203 is negative as the bunch approaches, but switches to positive as the bunch passes through the accelerator electrode 203. In this way, the bunch is accelerated as it enters the accelerator electrode 203 and is repelled as it exits. This results in an acceleration of the bunch. This process is repeated for each accelerator electrode 203 in the linear accelerator 200. Each accelerator electrode 203 increases the acceleration of the ions.

After the bunch exits the linear accelerator 200, the bunch may pass through a scanner 150, which serve to create the final ion beam 155 containing the desired species of ions. The scanner 150 causes the incoming ion beam to be fanned in the width direction so as to form a scanned ribbon ion beam.

As described above, the platen 160 may be in communication with a platen orientation motor 170. The platen orientation motor 170 may be configured to move the platen 160 in any of a plurality of different directions. For example, the platen orientation motor 170 may have the capability to rotate the platen 160. Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

The controller 180 may be in communication with the RF generator 204, so as to control the implant energy. In addition, the controller 180 may be in communication with the platen orientation motor 170, so as to adjust the tilt angle and twist angle of the platen 160. The controller 180 may also be in communication with other components, such as the RF generators 204.

Of course, the ion implantation system may include other components, such as quadrupole elements, additional electrodes to accelerate or decelerate the beam and other elements.

Figure 1C:
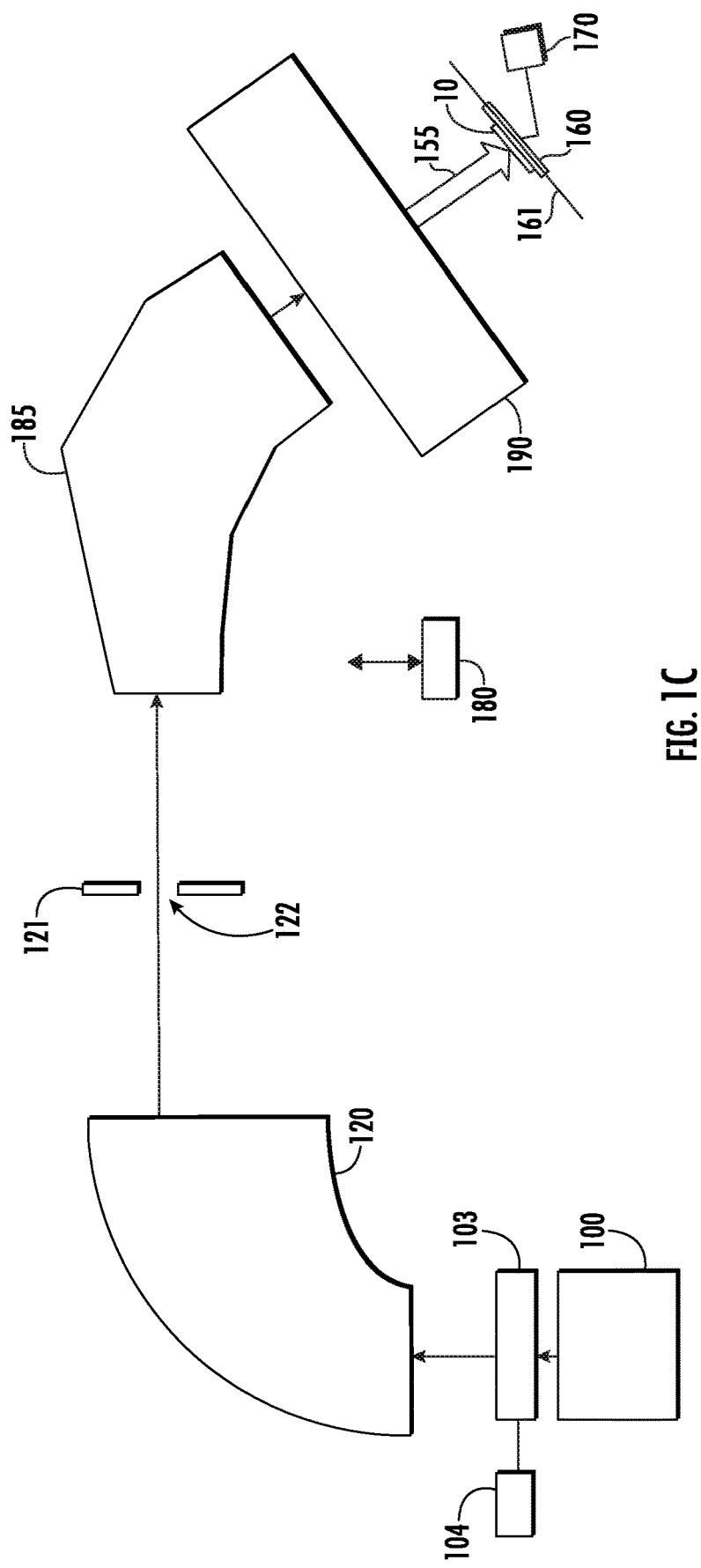
FIG. 1C shows a semiconductor processing apparatus that may be utilized according to a third embodiment.

A third embodiment is shown in FIG. 1C. Components that are common with FIG. 1A are given identical reference designators.

The semiconductor processing apparatus includes an ion source 100. In certain embodiments, the ion source 100 may be an RF ion source. In another embodiment, the ion source 100 may be an indirectly heated cathode (IHC). Other embodiments are also possible. For example, the plasma may be generated in a different manner, such as by a Bernas ion source, a capacitively coupled plasma (CCP) source, microwave or ECR (electron-cyclotron-resonance) ion source. The manner in which the ions is generated is not limited by this disclosure.

One chamber wall, referred to as the extraction plate, includes an extraction aperture. The extraction aperture may be an opening through which the ions generated in the ion source chamber are extracted and directed toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (y-dimension). In certain embodiments, a ribbon ion beam is extracted from the ion source 100. In other embodiments, a spot ion beam is extracted from the ion source 100.

Disposed outside and proximate the extraction aperture of the ion source 100 are extraction optics 103. In certain embodiments, the extraction optics 103 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an extraction power supply 104. The extraction power supply 104 may be used to bias one or more of the electrodes relative to the ion source 100 so as to attract ions through the extraction aperture. The voltage applied by the extraction power supply 104 to the extraction optics 103 may determine the energy of the extracted ions.

Located downstream from the extraction optics 103 is a mass analyzer 120. The mass analyzer 120 uses magnetic fields to guide the path of the extracted ions. The magnetic fields affect the flight path of ions according to their mass and charge. A mass resolving device 121 that has a resolving aperture 122 is disposed at the output, or distal end, of the mass analyzer 120.

By proper selection of the magnetic fields, only those ions that have a selected mass and charge will be directed through the resolving aperture 122. Other ions will strike the mass resolving device 121 or a wall of the mass analyzer 120 and will not travel any further in the system.

A collimator 185 is disposed downstream from the mass resolving device 121. The collimator 185 accepts the ions that pass through the resolving aperture 122 and creates a ribbon ion beam formed of a plurality of parallel or nearly parallel beamlets.

Located downstream from the collimator 185 may be an acceleration/deceleration stage 190. The acceleration/deceleration stage 190 may be referred to as an energy purity module. The energy purity module is a beam-line lens component configured to independently control deflection, acceleration, deceleration, and focus of the ion beam. For example, the energy purity module may be a vertical electrostatic energy filter (VEEF) or electrostatic filter (EF).

In certain embodiments, quadrupole lenses may be disposed in certain positions in the semiconductor processing apparatus. For example, a quadrupole lens may be disposed between the ion source 100 and the mass analyzer 120, between the mass analyzer 120 and the mass resolving device 121, and/or between the mass resolving device 121 and the collimator.

Of course, the ion implantation system may include other components, such as a scanner to create a ribbon beam from a spot ion beam, and additional electrodes to accelerate or decelerate the beam and other elements.

Thus, in this embodiment, the extraction optics 103 and/or the acceleration/deceleration stage 190 may be referred to as an accelerator, as these components are used to accelerate the ions to the desired implant energy.

The final ion beam 155 exits the acceleration/deceleration stage 190 and impacts the workpiece 10 disposed on the platen 160. The platen 160 may be in communication with a platen orientation motor 170. The platen orientation motor 170 may be configured to move the platen 160 in any of a plurality of different directions. For example, the platen orientation motor 170 may have the capability to rotate the platen 160. Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

Additionally, the semiconductor processing apparatus includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the extraction power supply 104 and other components, so as to control the implant energy. In addition, the controller 180 may be in communication with the platen orientation motor 170, so as to adjust the tilt angle and twist angle of the platen 160.

Thus, FIGS. 1A, 1B and 1C all show a semiconductor processing apparatus that includes an ion source 100, a mass analyzer 120, an accelerator, a platen 160, a controller 180 and a platen orientation motor 170.

For each implant, there may be an associated recipe, which includes the voltage applied to the accelerator, the dose, and the tilt and twist angles to be supplied by the platen orientation motor 170.

In operation, a workpiece 10 is disposed on the platen 160 and is implanted by the final ion beam 155. The workpiece 10 may be a silicon workpiece. The controller 180 may set the tilt and twist angles to be supplied by the platen orientation motor 170 prior to the implantation. Additionally, the controller 180 may set the voltage to be applied to the accelerator and the dose to be implanted.

Any of the semiconductor processing apparatus described above may be used to perform a series of implants so as to form an implanted region, having a desired dopant concentration profile.

In certain embodiments, the desired dopant concentration profile may be a rectangular or box profile, wherein the concentration of implanted atoms remains roughly constant over a predetermined thickness.

In this disclosure, thickness is defined as the maximum depth having a predetermined minimum concentration of atoms, less the minimum depth having that predetermined minimum concentration of atoms, wherein throughout the thickness, the dopant concentration is always at least equal to the predetermined minimum concentration.

As noted above, these implants are typically performed by modifying the implant energy for each implant so as to deposit ions at a plurality of different depths. The result is a thick implanted region having a roughly constant dopant concentration profile throughout the desired thickness. In this disclosure, a thick implanted region may refer to any implanted region having a thickness of 1 or more μm. In certain embodiments, a thick implanted region may refer to any implanted region having a thickness of 2 or more μm.

However, to improve the throughput of these operations, each of these semiconductor processing apparatuses may be configured such that these thick implanted regions are formed using a single implant energy.

For example, in one embodiment, it may be desirable to implant hydrogen ions into a silicon workpiece to create an implanted region having a minimum concentration of hydrogen atoms that is about 1E18 atoms/cm³. Further, the desired thickness of this implanted region may be about 4.5 μm.

Additionally, the desired depth of this implanted region may be between 3.5 μm and 8.1 μm. In other words, the maximum depth having the minimum concentration is 8.1 μm and the minimum depth having that minimum concentration is 3.5 μm. In certain embodiments, this implanted region may be a field stop layer.

Figure 2:
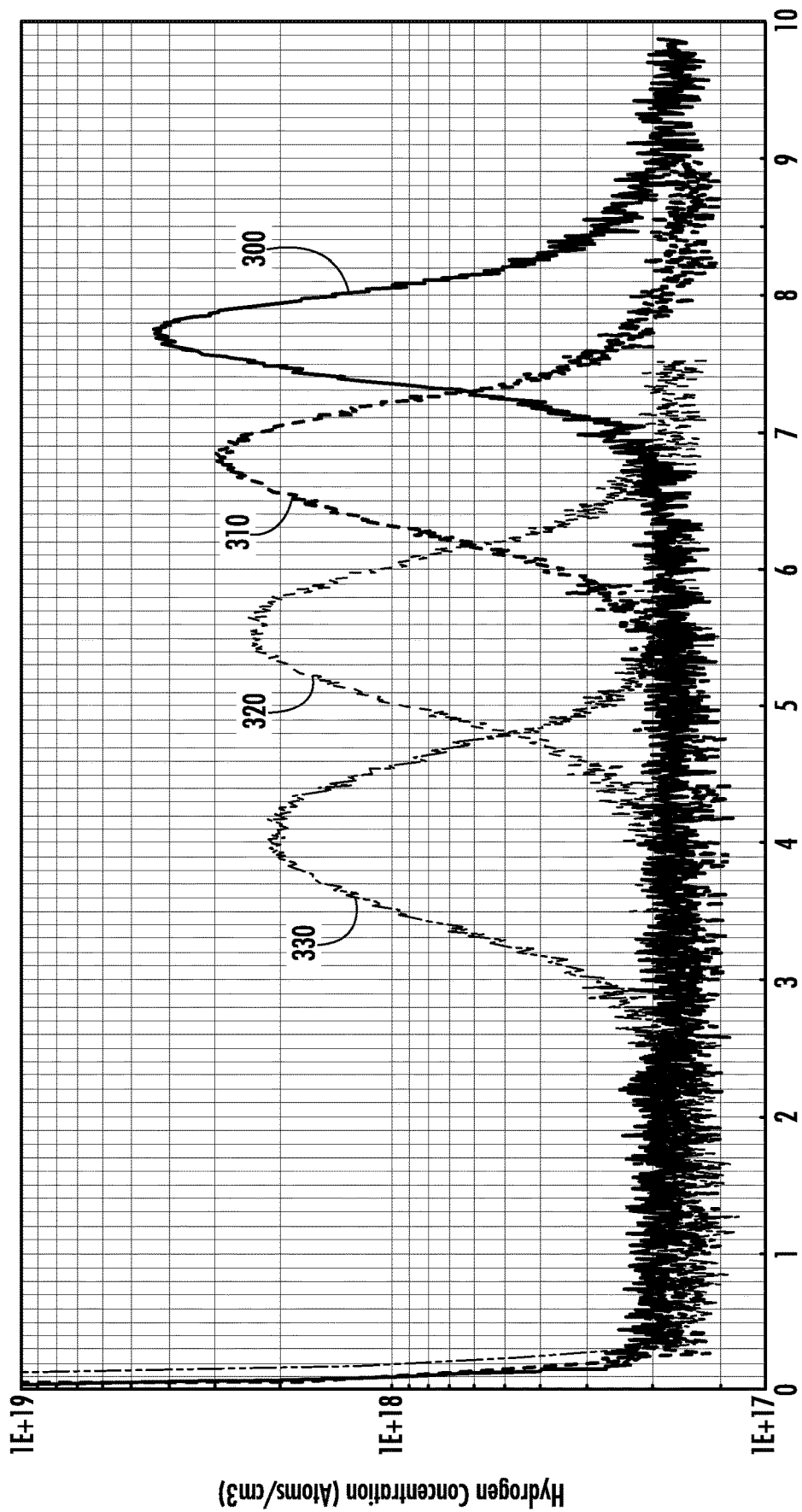
FIG. 2 shows four implants performed at the same implant energy but different tilt angles.

FIG. 2 shows four implant profiles as-implanted, where each implant is performed using the same implant energy. In this test, that implant energy is 600 keV, however, other implant energies may also be used. The dose for each implant was set to 2E14 atoms/cm². FIG. 2 and the associated data reflect the concentration of hydrogen atoms as-implanted, prior to any thermal treatment.

A first implant 300 is performed using a 7° tilt angle and a 0° twist angle. As shown in FIG. 2, most of the hydrogen ions from the first implant 300 are implanted at a depth of between 7.0 μm and 8.5 μm. The maximum concentration is about 4E18 atoms/cm³ and the depth of the maximum concentration (Rp) is at about 7.7 μm. This implant is used to implant the ions at the greatest depth. Note that the lowest depth wherein the concentration is greater than 1E18 is about 8.1 μm. Therefore, in certain embodiments, the implant energy is selected so as to implant ions to the maximum depth while the tilt angle is at or near 0°. In this disclosure, the phrase "at or near 0°" refers to a tilt angle less than 10°. In certain embodiments, the phrase refers to a tilt angle less than 5°. In certain embodiments, the phrase refers to a tilt angle less than 2°.

A second implant 310 is performed using a 30° tilt angle and a 0° twist angle. Most of the hydrogen ions from the second implant 310 are implanted at a depth of between 5.7 μm and 7.5 μm. The maximum concentration is about 3E18 atoms/cm³ and the depth of the maximum concentration (Rp) is at about 6.8 μm.

A third implant 320 is performed using a 45° tilt angle and a 0° twist angle. Most of the hydrogen ions from the third implant 320 are implanted at a depth of between 4.5 μm and 6.5 μm. The maximum concentration is about 2.5E18 atoms/cm³ and the depth of the maximum concentration (Rp) is at about 5.6 μm.

A fourth implant 330 is performed using a 60° tilt angle and a 0° twist angle. Most of the hydrogen ions from the fourth implant 330 are implanted at a depth of between 3.0 μm and 5.0 μm. The maximum concentration is about 2E18 atoms/cm³ and the depth of the maximum concentration (Rp) is at about 4.0 μm.

Figure 3:
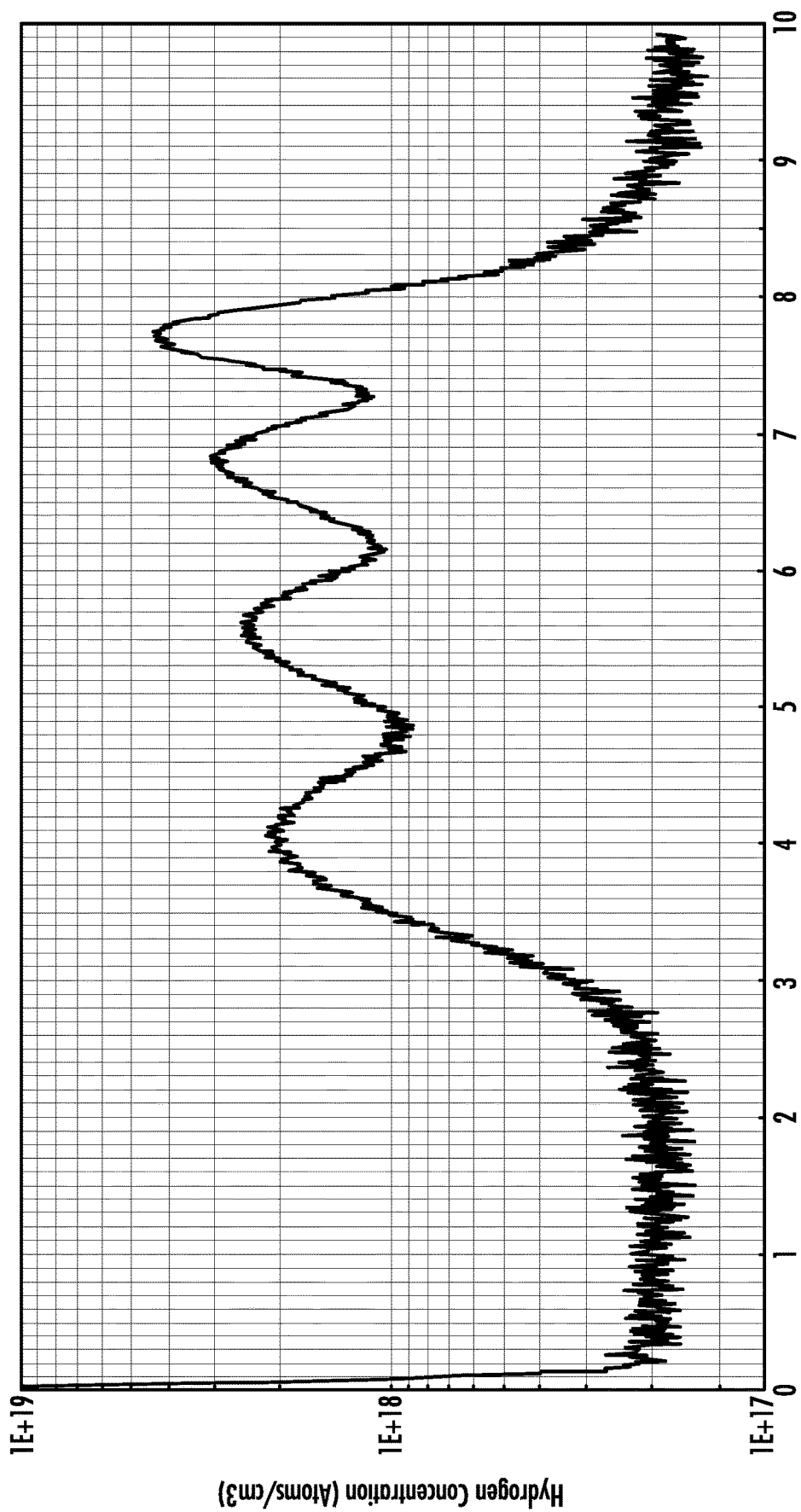
FIG. 3 shows the concentration of ions in the workpiece after the four implants shown in FIG. 2.

FIG. 3 shows the hydrogen concentration profile, as-implanted, as a function of depth after the four implants described in FIG. 2 are performed. FIG. 3 and the associated data reflect the concentrations as-implanted, prior to any thermal treatment. Note that the concentration of hydrogen ions is at least 1E18 from about 3.5 μm to about 8.1 μm. Thus, an implanted region having a thickness greater than 4 μm was formed using four implants having the same implant energy. Furthermore, the concentration is roughly constant, where the ratio of the maximum concentration to the minimum concentration throughout the desired thickness is less than 5.

Further, the concentration profile of FIG. 3 may be further improved. For example, if the dose of the fourth implant 330 is increased, the minimum concentration (which occurs at about 4.8 μm) may be increased. Further, if the dose of the first implant 300 is decreased, the maximum concentration (which occurs at a depth of about 7.7 μm) may be reduced, while still maintaining the desired minimum concentration throughout the desired range of depths.

Additionally, additional implants may be performed to fill in the troughs. For example, one or more implants may be performed at angles of about 18°, 37° and/or 57° to further flatten the concentration profile.

Thus, by varying the tilt angle and optionally the dose, it is possible to create a rectangular concentration profile where the ratio of the maximum concentration to the minimum concentration over the entire range of depths is less than 5. In certain embodiments, the ratio is less than 4. In some embodiments, the ratio is less than 3. In some embodiments, the ratio is less than 2.

If only the first two implants were performed, an implanted region having a thickness of about 1.8 μm (from about 6.8 μm to about 8.1 μm) would be formed. Further, the ratio of the maximum concentration to the minimum concentration over this range of depths is about 4. However, by adjusting the dose and optionally the tilt angle of these implants, as described above, the ratio may be reduced to less than 3 or less than 2, in some embodiments.

If only the first three implants were performed, an implanted region having a thickness of about 3.1 μm (from about 5.0 μm to about 8.1 μm) would be formed. Further, the ratio of the maximum concentration to the minimum concentration over this range of depths is about 4. However, by adjusting the dose and optionally the tilt angle of these implants, as described above, the ratio may be reduced to less than 3 or less than 2, in some embodiments.

Note that the straggle associated with each implant increases with increased tilt angle. In other words, the width of the dopant concentration profile for a particular implant typically becomes larger as the tilt angle of that implant increases. Thus, the distance between the Rp of the higher tilt angle implants may be greater than the distance between the Rp of the lower tilt angle implants. More specifically, the distance between the Rp of the fourth implant 330 and the third implant 320 is about 1.6 μm. In contrast, the distance between the Rp of the second implant 310 and the first implant 300 is only about 0.9 μm. However, because of the increased straggle at higher tilt angles, the combination of these implants results in a broader profile where the concentration is at or above about 1E18.

Thus, in certain embodiments, the tilt angles are selected based on the minimum desired concentration and the straggle associated with each implant. In this embodiment, each implant creates a concentration profile that resembles a bell curve. The width of the bell curve increases with increasing tilt angle, while the height of the bell curve decreases with increasing tilt angle.

In other words, the tilt angles may be selected such that the minimum concentration between any two adjacent Rp is above a predetermined minimum. For example, the predetermined minimum for FIG. 3 may be 1E18 atoms/cm$^3$. As shown in the figure, the minimum between the Rp of first implant 300 and the Rp of second implant 310 is about 1.2E18. The minimum between the Rp of second implant 310 and the Rp of third implant 320 is about 1.1E18. Finally, the minimum between the Rp of third implant 320 and the Rp of fourth implant 330 is about 1.0E18.

In certain embodiments, the first tilt angle is selected to be at or near 0°. The next tilt angle may be selected such that the lower depth at which that implant provides a concentration equal to about 50% of the predetermined minimum is the same as the upper depth at which the first implant provides a concentration equal to or slightly greater than 50% of the predetermined minimum. For example, as shown in FIG. 2, the first implant 300 provides a concentration of about 5E17 atoms/cm$^3$ (which is 50% of 1E18) at an upper depth of 7.3 μm. Similarly, the second implant 310 provides a concentration of about 5E17 atoms/cm$^3$ at a lower depth of 7.3 μm, and an upper depth of 6.2 μm. The second implant 310 may be performed at a tilt angle greater than the first tilt angle, such as between 10° and 40°. The third implant 320 provides a concentration of about 5E17 atoms/cm$^3$ at a lower depth of 6.2 μm, and an upper depth of 4.8 μm. The third implant 320 may be performed at a tilt angle greater than the second tilt angle, such as between 30° and 60°. Lastly, the fourth implant 330 provides a concentration of about 5E17 atoms/cm$^3$ at a lower depth of 3.2 μm. The fourth implant 330 may be performed at a tilt angle greater than the third tilt angle, such as between 40° and 70°.

Thus, as shown in FIG. 3, a field stop layer having a hydrogen concentration of greater than 1E18 ions/cm$^3$ and thickness of about 4.5 μm may be created using a single implant energy. Further, the ratio of the maximum concentration to the minimum concentration is less than 5. As stated above, by varying the dose of each implant, the ratio may be reduced. Further, by adding additional implants, using the same implant energy and other tilt angles, the ratio can be reduced. Thus, the ratio may be less than 4, less than 3 or less than 2.

This technique is also useful for other semiconductor applications.

For example, this technique is not limited to hydrogen ions.

For example, any desired species, including but not limited to boron, arsenic, and phosphorus may be used.

Furthermore, this technique may be used to create other types of implanted regions.

In another example, a photodiode may be fabricated with a deep trench implanted region. This implanted region may be about 2 μm in thickness and may have a boron concentration of about 1E16 atoms/cm$^3$. In certain embodiments, this implanted region may typically be created using more than 6 different implant energies.

In accordance with one embodiment, using the present technique, this implanted region may be fabricated using a single implant energy and two or more different tilt angles.

In another embodiment, this implanted region may be created using two or more implant energies, where two or more implants at different tilt angles are performed at each implant energy. For example, the implanted region may be created by performing implants at a first implant energy, with two or three different tilt angles and implants at a second implant energy, with two or three different tilt angles. In this case, a delay is incurred when changing the implant energy from the first implant energy to the second implant energy. However, this delay is far less than the delays associated with 6 different implant energies.

Further, the present technique may be used to create gradient profiles. A gradient profile is one where the log of the dopant concentration profile varies roughly linearly as a function of depth. For example, a well may be N-doped where the maximum concentration occurs at a depth of about 0.1 μm and decreases exponentially to a depth of about 1.0 μm. For example, the concentration may decrease by a factor of about 35 over 0.9 μm. In certain embodiments, the decrease in concentration may appear roughly linear when plotted in log-linear, also referred to as semi-log, format. Using a single implant energy, with several different tilt angles, a similar concentration profile may be created.

This gradient profile may be used to create wells for logic devices. In those logic devices, a well is typically created beneath the gate in a transistor. Depending on the type of transistor, the well may be doped with a P-type dopant, such as boron, or an N-type dopant, such as phosphorus.

Figure 4:
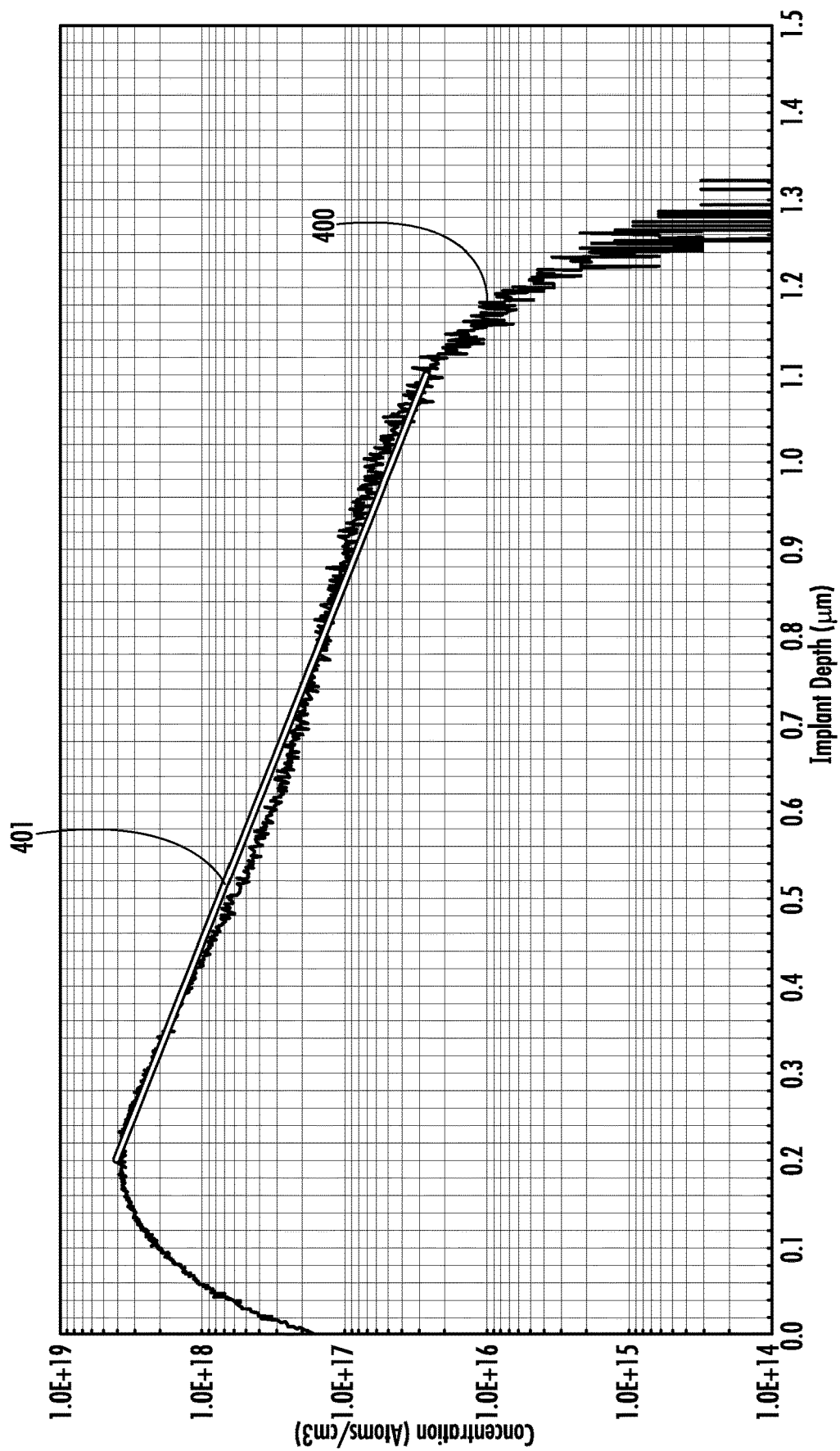
FIG. 4 shows a gradient concentration profile created by three implants performed at the same implant energy but different tilt angles.

FIG. 4 shows a simulation of a resultant gradient dopant concentration profile 400, as-implanted, that was created using one implant energy and three different tilt angles. In this example, the implant energy was 180 keV and the implanted species is phosphorus. Of course, other species and implant energies may be used. For example, any desired species, including but not limited to boron, arsenic, and hydrogen may be used.

FIG. 4 and the associated data reflect the concentrations as-implanted, prior to any thermal treatment. In this figure, the dopant concentration decreases roughly linearly from about 0.2 μm to about 1.1 μm, when viewed on a semi-log graph. Specifically, in this gradient profile, the concentration decreases from 4E18 atoms/cm$^3$ to about 2E16 atoms/cm$^3$ over this range of depths. If the gradient profile decreased exactly linearly on the semi-log graph, the equation of the line 401 over the desired range of depths may be expressed as:

$\log(y)=mx+b$, where $y$ is the concentration, $m$ is the slope; and $b$ is the $y$ intercept.

The graph shown in FIG. 4 shows that the resultant gradient dopant concentration profile 400, as-implanted, deviates from this straight line 401 by less than a factor of 2 throughout the desired range of depths. In this disclosure, the phrase "roughly linearly" means that the actual dopant concentration deviates from a straight line 401 by a factor of 2 or less when plotted on a semi-log graph. In certain embodiments, the deviation may be less than a factor of 1.5. In other embodiments, the deviation may be less than a factor of 1.25.

FIG. 5 shows the simulation of the three implants, as-implanted, that were used to create the dopant profile shown in FIG. 4. Again, FIG. 5 and the associated data reflect the concentrations as-implanted, prior to any thermal treatment. Note that the first implant 500 does not show the bell shape that was evident in FIG. 2. This is because the tilt angle of this first implant 500 was selected to allow channeling of atoms in the workpiece. This channeling effect produces a more constant dopant profile of about 1E17 atoms/cm3 across the range of depths from about 0.2 μm to about 0.95 μm. In one embodiment, this first implant 500 may be performed at a dose of 1E13, a tilt angle of 0° and a twist angle of 0°. The second implant 510 occurs at an angle greater than that of the first implant 500 and shows a peak concentration at about 0.3 μm and the maximum concentration of about 2E18. The dose of the second implant 510 may be greater than that of the first implant 500, such as but not limited to 5E13. The first implant 500 and second implant 510 provide the desired gradient profile for depths greater than about 0.4 μm. The third implant 520 is used to provide the greater concentration that is found at depths less than 0.4 μm. The dose of the third implant 520 may be the same as the dose of the second implant 510. Thus, to implant at these shallow depths, the tilt angle of the third implant 520 may be increased, such as to a value of 30° or greater. The doses of these three implants may be the same or may be different. For example, as described above, the first implant 500 may be performed at a lower dose to provide the constant dopant profile shown in the figure. In certain embodiments, the first implant 500 may not be performed, as the second implant 510 and third implant 520 may also produce a gradient profile.

Further, as described above, the shape of the concentration profile may be further improved by varying the dose of each implant. Additionally, additional implants at tilt angles between the minimum and maximum angle may be used to further improve the shape of the concentration profile. The implant energy was determined based on the maximum depth of the desired concentration profile. Like the box profile, the first implant may be performed at an angle that is at or near 0°. The second tilt angle may be greater than the first tilt angle, such as between 1° and 30°. The third tilt angle may be greater than the second tilt angle, such as between 30° and 65°.

The values noted above are intended to create a profile having a gradient similar to that shown in FIG. 4. If a more steep or more gradual gradient is desired, the tilt angles and doses may be adjusted accordingly. Similarly, if the desired concentrations are different than those shown in FIG. 4, the tilt angles and doses may be adjusted.

Thus, in addition to rectangular or box profiles, the present technique also allows the creation of gradient concentration profiles, using a single implant energy with multiple tilt angles.

This disclosure is not limited to the creation of box and gradient profiles. Rather, the use of a single implant energy and multiple tilt angles may also be used to create other shaped dopant concentration profiles.

The system and method described herein have many advantages. In one test, it was determined that field stop layer having a thickness of 4.5 μm can be formed using a single implant energy of 600 keV. This field stop layer was performed using four different tilt angles. In contrast, this field stop layer is traditionally fabricated using three or more different implant energies. It was noted that the time to change the implant energy and then recalibrate all of the components of the semiconductor processing apparatus to each new implant energy can be as long as 5 to 6 minutes. Thus, the ability to achieve implanted regions having a thickness in excess of 1 μm without changing the implant energy may substantially reduce the time to form the implanted region.

Similarly, typically a graded P-well or N-well is fabricated using three or more different implant energies. The ability to fabricate these structures with a single implant energy may substantially increase throughput. For example, a gradient profile, similar to that created using three different implant energies, was created using a single implant energy and three different tilt angles. This results in a significant improvement in throughput and efficiency.

Likewise, an isolation trench for a photodiode may have a thickness of about 2 μm and a concentration of 2E16 boron atoms/cm$^3$. In certain prior art applications, this isolation trench is fabricated using 6 or more different implant energies. By using a single implant energy and a variety of tilt angles, the time to fabricate this isolation trench can be reduced significantly. In fact, even if two different implant energies are used to create this isolation trench, the throughput is still much improved as compared to the current process.

Thus, the present system and method reduces the time to create an implanted region with the desired dopant concentration profile. As noted above, when the implant energy is varied, the voltages applied to various electrodes, accelerators, acceleration/deceleration stages, magnets, and focusing elements are changed. Modifying these voltages may take many minutes. However, only the platen orientation motor 170 is adjusted to change the tilt angle, which needs no additional tuning after being moved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming an implanted region having a rectangular concentration profile within a semiconductor workpiece, comprising:
    performing a first implant on the semiconductor workpiece, wherein the first implant is performed at a predetermined implant energy and a first tilt angle, wherein a maximum concentration of ions implanted by the first implant occurs at a first depth; and
    performing a second implant on the semiconductor workpiece, wherein the second implant is performed at the predetermined implant energy and a second tilt angle, wherein a maximum concentration of ions implanted by the second implant occurs at a second depth, less than the first depth;
    wherein the second tilt angle is selected such that, after the first and second implants are performed, a minimum concentration between the first depth and the second depth is greater than a predetermined minimum concentration.

2. The method of claim 1, wherein the first tilt angle is at or near 0° and the predetermined implant energy is selected such the first depth is at a desired depth.

3. The method of claim 1, further comprising:
    performing a third implant on the semiconductor workpiece, wherein the third implant is performed at the predetermined implant energy and a third tilt angle, greater than the second tilt angle, wherein a maximum concentration of ions implanted by the third implant occurs at a third depth, less than the first depth and the second depth;
    wherein the third tilt angle is selected such that, after the first, second and third implants are performed, a minimum concentration between the first depth and the third depth is greater than the predetermined minimum concentration.

4. The method of claim 3, wherein a thickness of the implanted region, wherein thickness is defined as a maximum depth having a concentration greater than the predetermined minimum concentration, less a minimum depth having the concentration greater than the predetermined minimum concentration, is greater than 1 µm.

5. The method of claim 4, wherein the thickness of the implanted region is greater than 2 µm.

6. The method of claim 3, wherein a ratio of a maximum concentration between the first depth and the third depth to the minimum concentration is less than 5.

7. The method of claim 6, wherein the ratio of the maximum concentration to the minimum concentration is less than 4.

8. The method of claim 7, wherein the ratio of the maximum concentration to the minimum concentration is less than 3.

9. The method of claim 3, wherein the first implant is performed with a first dose, the second implant is performed with a second dose and the third implant is performed with a third dose, wherein the first dose, the second dose and the third dose are not all the same value.

10. The method of claim 3, wherein one or more additional implants are performed at additional tilt angles, between the first tilt angle and the third tilt angle, so as to reduce a ratio of a maximum concentration between the first depth and the third depth to the minimum concentration.

11. A method of forming an implanted region having a gradient concentration profile within a semiconductor workpiece, comprising:
    performing a first implant on the semiconductor workpiece, wherein the first implant is performed at a predetermined implant energy, a first dose and a first tilt angle; and
    performing a second implant on the semiconductor workpiece, wherein the second implant is performed at the predetermined implant energy, a second dose and a second tilt angle;
    wherein the first tilt angle, the first dose, the second tilt angle, and the second dose are selected such that, after the first and second implants are performed, a concentration of implanted atoms decreases between a first depth and a second depth.

12. The method of claim 11, wherein, when plotted on a semi-log graph, a profile of the concentration of implanted atoms decreases roughly linearly between the first depth and the second depth.

13. The method of claim 11, wherein the first dose is different from the second dose.

14. The method of claim 11, further comprising:
    performing a third implant on the semiconductor workpiece, wherein the third implant is performed at the predetermined implant energy, a third dose and a third tilt angle;
    wherein the third tilt angle and the third dose are selected such that, after the first, second and third implants are performed, when plotted on a semi-log graph, a profile of the concentration of implanted atoms decreases roughly linearly between the first depth and the second depth.

15. The method of claim 14, wherein one of the implants is performed at a tilt angle to allow channeling of atoms in the semiconductor workpiece.

* * * * *